(12) United States Patent
Nazeeruddin et al.

(10) Patent No.: US 8,518,557 B2
(45) Date of Patent: Aug. 27, 2013

(54) LIGHT EMITTING MATERIALS COMPRISING NOVEL ORTHO-METALATED TRANSITION METAL COMPLEXES

(75) Inventors: Mohammad Khaja Nazeeruddin, Ecublens (CH); Cedric Klein, Brumath (FR); Michael Graetzel, Saint Sulpice (CH)

(73) Assignee: Solvay (Societe Anonyme), Brussels (BE)

( * ) Notice: Subject to any disclaimer, the term of this patent is extended or adjusted under 35 U.S.C. 154(b) by 836 days.

(21) Appl. No.: 12/444,793

(22) PCT Filed: Oct. 11, 2007

(86) PCT No.: PCT/EP2007/060836
§ 371 (c)(1),
(2), (4) Date: Apr. 8, 2009

(87) PCT Pub. No.: WO2008/043815
PCT Pub. Date: Apr. 17, 2008

(65) Prior Publication Data
US 2010/0102711 A1    Apr. 29, 2010

(30) Foreign Application Priority Data
Oct. 12, 2006   (EP) .................................... 06122205

(51) Int. Cl.
*H01L 51/54*   (2006.01)
*C09K 11/06*   (2006.01)

(52) U.S. Cl.
USPC ........... 428/690; 428/917; 313/504; 313/506; 252/301.16; 257/40; 257/102; 257/E51.044; 548/103

(58) Field of Classification Search
None
See application file for complete search history.

(56) References Cited

U.S. PATENT DOCUMENTS

| | | | |
|---|---|---|---|
| 6,670,645 B2 | 12/2003 | Grushin et al. | |
| 6,687,266 B1 | 2/2004 | Ma et al. | |
| 2004/0124766 A1* | 7/2004 | Nakagawa et al. | 313/504 |
| 2006/0008670 A1 | 1/2006 | Lin et al. | |
| 2006/0024522 A1 | 2/2006 | Thompson | |
| 2006/0142604 A1 | 6/2006 | Bach et al. | |
| 2006/0197077 A1* | 9/2006 | Okuda et al. | 257/40 |
| 2006/0280966 A1* | 12/2006 | Otsu et al. | 428/690 |

FOREIGN PATENT DOCUMENTS

| | | |
|---|---|---|
| EP | 1486552 A1 | 12/2004 |
| EP | 1 784 056 A1 | 5/2007 |
| EP | 1936714 A1 | 6/2008 |
| JP | 2003-109758 A | 4/2003 |
| JP | 20030113163 A | 4/2003 |
| JP | 20030113164 A | 4/2003 |
| JP | 2005-068110 A | 3/2005 |
| WO | WO 2004085449 A1 | 10/2004 |
| WO | WO 2006/009024 A1 | 1/2006 |

OTHER PUBLICATIONS

M. A. Baldo; S. Lamansky; P. E. Burrows ; M. E. Thompson ; S. R. Forrest—Very high-efficiency green organic light-emitting devices based on electrophosphorescence—Appl. phys. lett.. 1999, vol. 75, Iss 1, p. 4.

K. Dedeian, P. I. Djurovich, F. O. Garces, G. Carlson, R. J. Watts—A new synthetic route to the preparation of a series of strong photoreducing agents: fac-tris-ortho-metalated complexes of iridium(III) with substituted 2-phenylpyridines—Inorg. Chem., 1991, 30 (8), pp. 1685-1687.

Shuncheng Liu, Shahid N. Shaikh, Jon Zubieta—Polyoxomolybdate-o-benzoquinone interactions. Synthesis and structure of a diacetal derivative, [Mo4O15(OH)(C14H8)]3-, from 9,10-phenanthrenequinone carbonyl insertion. Comparison to the reaction products with tetrachloro-1,2-benzoquinone, the ligand-bridged binuclear complexes [(MoO2Cl2)2L]2-, L =(C6Cl2O4)2- and (C2O4)2-, formed via carbonyl insertion and chloride transfer—Inorg. Chem., 1988, 27 (18), pp. 3064-3066.

Mirco G. Colombo, Thomas C. Brunold, Toni Riedener, Hans U. Guedel, Marcel Fortsch, Hans-Beat Buergi—Facial tris cyclometalated rhodium(3+) and iridium(3+) complexes: their synthesis, structure, and optical spectroscopic properties—Inorg. Chem., 1994, 33 (3), pp. 545-550.

J.H. Van Diemen, J.G. Haasnoot, R. Hage, E. Muller and J. Reedijk—Synthesis, x-ray structure, electrochemical and electronic properties of [3-(pyridin-2-yl)-4-methyl-1,2,4-triazole-bis(2-(2'-phenylato)pyridine)-iridium(III)] hexafluorophosphate—Inorganica Chimica Acta, 1991, vol. 181, Iss 2, p. 245-251.

Edwin C. Constable and Troy A. Leese—Metal exchange in organomercury complexes; a facile route to cyclometallated transition metal complexes—Journal of Organometallic Chemistry, 1987, vol. 335, Iss 3, p. 293-299.

(Continued)

Primary Examiner — Michael H Wilson
(74) Attorney, Agent, or Firm — Foley & Lardner LLP (57) ABSTRACT

This invention pertains to light emitting materials comprising novel ortho-metalated transition metal complexes [C^N]$_2$ML comprising two orthometalated ligands having imidazole moieties and an ancillary ligand of β-diketonate type. The ortho-metalated transition metal complexes are represented by formula (I):

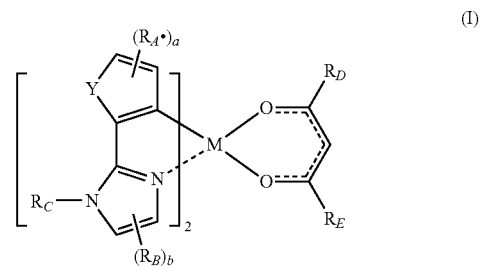

It has been surprisingly found that when the metal has bound thereto both orthometalated ligands comprising imidazole moieties and an ancillary ligand of β-diketonate type, the ligands advantageously participate in the emission process, significantly broadening emission in the visible region and enabling appreciable improvement of the white emission efficiency of complexes [C^N]$_2$ML. Additional objects of the invention are the use of the light emitting materials and organic light emitting device comprising the light emitting material.

19 Claims, 4 Drawing Sheets

(56) References Cited

OTHER PUBLICATIONS

K. A. King, P. J. Spellane, Richard J. Watts—Excited-state properties of a triply ortho-metalated iridium(III) complex—J. Am. Chem. Soc., 1985, 107 (5), pp. 1431-1432.

Lohse, Olivier, et al.—The Palladium Catalyzed Suzuki Coupling of 2- and 4-chloropyridines.—Syn. Lett.. 1999, No. 1, p. 45-48.

S. Sprouse, K. A. King, P. J. Spellane, R. J. Watts—Photophysical effects of metal-carbon .sigma. bonds in ortho-metalated complexes of iridium(III) and rhodium(III)—J. Am. Chem. Soc., 1984, 106 (22), pp. 6647-6653.

Sergey Lamansky, Peter Djurovich, Drew Murphy, Feras Abdel-Razzaq, Raymond Kwong, Irina Tsyba, Manfred Bortz, Becky Mui, Robert Bau, and Mark E. Thompson—Synthesis and Characterization of Phosphorescent Cyclometalated Iridium Complexes—Inorg. Chem., 2001, 40 (7), pp. 1704-1711.

Sergey Lamansky, Peter Djurovich, Drew Murphy, Feras Abdel-Razzaq, Hae-Eun Lee, Chihaya Adachi, Paul E. Burrows, Stephen R. Forrest, and Mark E. Thompson—Highly Phosphorescent Bis-Cyclometalated Iridium Complexes: Synthesis, Photophysical Characterization, and Use in Organic Light Emitting Diodes—J. Am. Chem. Soc., 2001, 123 (18), pp. 4304-4312.

International Search Report dated Jan. 10, 2008 for International Application PCT/EP2007/060836 (2p.).

Machine Translation of JP 2003-109758 (122 pages).

Machine Translation of JP 2005-068110 (84 pages).

* cited by examiner

LIGHT EMITTING MATERIALS COMPRISING NOVEL ORTHO-METALATED TRANSITION METAL COMPLEXES

CROSS-REFERENCE TO RELATED APPLICATIONS

This application is a U.S. national stage application under 35 U.S.C. §371 of International Application No. PCT/EP2007/060836 filed Oct. 11, 2007, which claims priority to European Application No. 06122205.5 filed Oct. 12, 2006, these applications being herein incorporated by reference in their entirety for all purposes.

TECHNICAL FIELD

This invention relates to a light-emitting material, to the use of said material and to light-emitting device capable of converting electric energy to light.

BACKGROUND ART

Today, various display devices have been under active study and development, in particular those based on electroluminescence (EL) from organic materials.

In the contrast to photoluminescence, i.e. the light emission from an active material as a consequence of optical absorption and relaxation by radiative decay of an excited state, electroluminescence (EL) is a non-thermal generation of light resulting from the application of an electric field to a substrate. In this latter case, excitation is accomplished by recombination of charge carriers of contrary signs (electrons and holes) injected into an organic semiconductor in the presence of an external circuit.

A simple prototype of an organic light-emitting diode (OLED), i.e. a single layer OLED, is typically composed of a thin film of the active organic material which is sandwiched between two electrodes, one of which needs to be semitransparent in order to observe light emission from the organic layer; usually an indium tin oxide (ITO)-coated glass substrate is used as anode.

If an external voltage is applied to the two electrodes, charge carriers, i.e. holes, at the anode and electrons at the cathode are injected to the organic layer beyond a specific threshold voltage depending on the organic material applied. In the presence of an electric field, charge carriers move through the active layer and are non-radiatively discharged when they reach the oppositely charged electrode. However, if a hole and an electron encounter one another while drifting through the organic layer, excited singlet (anti-symmetric) and triplet (symmetric) states, so-called excitons, are formed. Light is thus generated in the organic material from the decay of molecular excited states (or excitons). For every three triplet excitons that are formed by electrical excitation in an OLED, only one anti-symmetric state (singlet) exciton is created.

Many organic materials exhibit fluorescence (i.e. luminescence from a symmetry-allowed process) from singlet excitons: since this process occurs between states of same symmetry it may be very efficient. On the contrary, if the symmetry of an exciton is different from the one of the ground state, then the radiative relaxation of the exciton is disallowed and luminescence will be slow and inefficient. Because the ground state is usually anti-symmetric, decay from a triplet breaks symmetry: the process is thus disallowed and efficiency of EL is very low. Thus the energy contained in the triplet states is mostly wasted.

Luminescence from a symmetry-disallowed process is known as phosphorescence. Characteristically, phosphorescence may persist for up to several seconds after excitation due to the low probability of the transition, in contrast to fluorescence which originates in the rapid decay.

However, only a few organic materials have been identified which show efficient room temperature phosphorescence from triplets.

Successful utilization of phosphorescent materials holds enormous promises for organic electroluminescent devices. For example, an advantage of utilizing phosphorescent materials is that all excitons (formed by combination of holes and electrons in an EL), which are (in part) triplet-based in phosphorescent devices, may participate in energy transfer and luminescence. This can be achieved either via phosphorescence emission itself, or using phosphorescent materials for improving efficiency of the fluorescence process as a phosphorescent host or a dopant in a fluorescent guest, with phosphorescence from a triplet state of the host enabling energy transfer from a triplet state of the host to a singlet state of the guest.

As a means for improving the properties of light-emitting devices, there has been reported a green light-emitting device utilizing the emission from ortho-metalated iridium complex Non Patent Citation 0001: (Ir(ppy)$_3$:tris-ortho-metalated complex of iridium (III) with 2-phenylpyridine (ppy). *Appl. phys. lett.*, 1999 vol. 75, p. 4. ISSN 0003-6951.

Moreover,

Patent Citation 0001: US 20060008670 (UNIVERSAL DISPLAY CORPORATION). 2006 Jan., 12.

discloses an organic light emitting device having an anode, a cathode and an organic layer disposed between the anode and the cathode, said organic layer comprising a complex having one or more arylimidazole, aryltriazole or aryltetrazole derivative ligands chosen, inter alia, among those complying with formula (A) here below:

wherein m is the number of photoactive ligands, which may be any integer from 1 to the maximum number of ligands that may be attached to the metal (that is to say n can be zero); (X—Y) is an ancillary ligand. Preferred complexes are those having a "tris" configuration (i.e. m=3 and n=0) and wherein the metal is Iridium. Said document specifically discloses the tris-orthometallated complex of formula (B) here below:

(B)

Also,

Patent Citation 0002: US 2006024522 (THE UNIVERSITY OF SOUTHERN CALIFORNIA PARK). 2006, Feb. 2.

discloses an organic light emitting device having an anode, a cathode and an organic layer disposed between the anode and the cathode, said organic layer comprising a compound bearing one or more carbene ligands (i.e. a compound having a divalent carbon atom with only six electrons in its valence shell when not coordinated to a metal). Among a wide class of complexes bearing carbine ligands, mention is notably made of those comprising a 1-phenyl-3-methyl-imidazolin-2-ylidene ligand, as sketched in formula (C) here below, wherein the imidazole ring and the phenyl moiety are linked via the nitrogen atom in 1-position of said imidazole ring:

(C)

Also,

Patent Citation 0003: EP 1486552 A (SONY CORPORATION). 2004, Dec. 15.

discloses heterocycle-containing Ir complexes which emit light in blue to green region, complying with following formula:

Still,

Patent Citation 0004: U.S. Pat. No. 6,687,266 (UNIVERSAL DISPLAY CORPORATION & UNIVERSITY OF SOUTHERN CALIFORNIA). 2004, Feb. 3.

discloses light emitting materials having the structure wherein both A and B are (hetero)aryl rings. As an example of preferred structure, this document discloses the following compound:

Generally, the light emitting material of the prior art provides electroluminescence emission in a relatively narrow band centered near selected spectral regions, and efforts are devoted to tune these emission bands to make them correspond to one of the three primary colours (red, green and blue) so that they may be used as a coloured layer in an OLED.

Nevertheless, another approach which is currently intensively pursued is to develop white-electroluminescence emission, i.e. emitting in a very broad range of wavelengths covering the whole visible wavelengths domain, so that the emitted light mimes natural white light (e.g. sun light or light emitted from an incandescent lamp).

Earlier white-light LEDs were made from a combination of atoms or molecules with different energy gaps, so that the LED emitted light at many wavelengths, each of them corresponding to one molecule, simulating white light. In practice, however, the different materials used in these devices degrade at different rates, so the spectrum of such white-light LEDs changes over time. This makes them unsuitable for use as lights, which must have a stable spectrum over their entire lifetime.

This spawned one of today's hottest application areas for illuminating homes, offices, and industrial plants.

High-efficiency white OLEDs are also desirable as an alternative to full-color active matrix OLEDs because they can be coupled with color filters to circumvent the problematic shadow mask for RGB (Red/Green/Blue) pixelation in production and can help achieve higher display resolution.

Also white emitting materials can be advantageously employed for manufacturing full-colour displays, e.g. flat panel displays, by fabricating an array of organic light-emitting devices that emits white light on one substrate, and incorporating a colour control or conversion array previously fabricated on the same or another substrate so as to achieve a full-color display.

However, since the foregoing light-emitting materials of the prior art do not display emission in the whole visible region, i.e. their emission bands, generally limited to green, are relatively narrow and centered near selected spectral regions, these materials cannot be successfully employed in application wherein a white emission is required.

It has thus been desired to develop light-emitting materials capable of emitting white light.

Efficient long-lived white-light emitters with good colour coordinates are a recognized current shortfall in the field of organic electroluminescent devices.

DISCLOSURE OF INVENTION

It is thus a first object of the invention to provide a light emitting material comprising a neutral ortho-metalated complex comprising ancillary ligands as detailed here below.

Still object of the invention are the use of said light emitting material and organic light emitting device comprising said light emitting material.

A first object of the invention is to provide for a light emitting material comprising a neutral complex of formula (I):

wherein:
M represents a transition metal of atomic number of at least 40, preferably of groups 8 to 12, more preferably Ir or Pt, most preferably Ir;
Y is a group chosen among the group consisting of —CH=CH—, —CR=CH—, —CR=CR—, N—H, N—$R^1$, O, S or Se; preferably Y is a group selected among —CH=CH—, —CR=CH— or S; most preferably Y is —CH=CH—;
R is the same or different at each occurrence and is —F, —Cl, —Br, —$NO_2$, —CN; a straight-chain or branched or cyclic alkyl or alkoxy group or dialkylamino group having from 1 to 20 carbon atoms, in each of which one or more nonadjacent —$CH_2$— groups may be replaced by —O—, —S—, —$NR^1$—, or —$CONR^2$—, and in each of which one or more hydrogen atoms may be replaced by F; an aryl or heteroaryl group having from 4 to 14 carbon atoms which may be substituted by one or more non aromatic radicals; and a plurality of substituents R, either on the same ring or on the two different rings, may in turn together form a further mono- or polycyclic ring system, optionally aromatic;
$R^1$, $R^2$, the same or different from each other and at each occurrence, are independently H or an aliphatic or aromatic hydrocarbon radical having from 1 to 20 carbon atoms;
$R_A$ and $R_B$, equal or different from each other and at each occurrence are independently selected among —F, —Cl, —Br, —$NO_2$, —CN; a straight-chain or branched or cyclic alkyl or alkoxy group having from 1 to 20 carbon atoms, in each of which one or more nonadjacent —$CH_2$— groups may be replaced by —O—, —S—, —$NR^1$—, or —$CONR^2$—, and in each of which one or more hydrogen atoms may be replaced by F; an aryl or heteroaryl group having from 4 to 14 carbon atoms which may be substituted by one or more nonaromatic radicals; preferably $R_A$ and/or $R_B$ are fluorine group(s) (—F) and/or alkoxy group(s) having from 1 to 20 carbon atoms;
$R_C$, $R_D$ and $R_E$, equal or different from each other and at each occurrence, are independently chosen among $C_1$-$C_6$ alkyl or aryl, fluoro- or perfluoro-alkyl or aryl groups, e.g. —$CH_3$, —$C_6H_5$, —$C_6H_4(CH_3)$, -n$C_4H_9$, -i$C_3H_7$, —$CF_3$, —$C_2F_5$, —$C_6F_5$, —$C_3F_7$ or $C_1$-$C_6$ alkyl, fluoro- or perfluoroalkyl groups having one or more ether groups; preferably $R_C$, $R_D$ and $R_E$ are independently chosen among $C_1$-$C_6$ alkyl groups; more preferably $R_C$, $R_D$ and $R_E$ being selected from methyl, ethyl, n-propyl, i-propyl, n-butyl groups;
a is an integer from 0 to 4;
b is an integer from 0 to 2.

The two chelating monoanionic ligands bound to the metal through a carbon and a nitrogen atom as above specified in formula (I), comprising the imidazole hereroaromatic ring are generally denoted as orthometalated ligands (C^N ligands, hereinafter).

The chelating β-diketonate monoanionic ligand bound to the metal through the two oxygen atoms is generally denoted as ancillary ligand (L).

It has been surprisingly found that when the metal has bound thereto both ortho-metalated ligands comprising imidazole moieties which are not condensed to a further aromatic ring (i.e. wherein the imidazole ring is not part of a polycyclic heteroaromatic system) and an ancillary ligand of β-diketonate type, said ligands advantageously participate in the emission process, significantly broadening emission in the visible region and enabling appreciable improvement of the white emission efficiency of complexes [C^N]$_2$ML.

Neutral complexes complying with formula (I) here above are also preferred over ionic (cationic or anionic) complexes because they are generally less sensitive to moisture and they can be advantageously sublimated for throughout purification.

Preferably, the light emitting material of the invention comprises a neutral complex of formula (II):

wherein M, a, b, $R_A$, $R_B$, $R_C$, $R_D$ and $R_E$ have the same meaning as above defined.

A neutral complex which gave excellent result is complex of formula (III) here below:

(III)

Neutral complex of formula (III) comprising 2-phenyl-N-methylimidazole ortho-metalated ligands and an acetylacetonate as ancillary ligand is particularly advantageous for the purposes of the invention because of its broad emission in the white region with high white light emission efficiency.

The synthesis of complexes of formula (I) here above, i.e. metal complex comprising two orthometalated ligands (C^N ligands) and a β-diketonate ligand (L), as above specified, can be accomplished by any known method. Details of synthetic methods suitable for the preparation of complexes of formula (I) here above are notably disclosed in "Inorg. Chem.", No. 30, pag. 1685 (1991); "Inorg. Chem.", No. 27, pag. 3464 (1988) "Inorg. Chem.", No. 33, pag. 545 (1994); "Inorg. Chem. Acta", No. 181, pag. 245 (1991), "J. Organomet. Chem.", No. 35, pag. 293 (198'7), "J. Am. Chem. Soc.", No. 107, pag. 1431 (1985).

Generally, according to a first embodiment, complexes complying with formula (I) here above can be prepared according to the following reaction scheme:

Acid forms of the orthometalated ligands (H—C^N) and of ancillary ligands (L-H) can be either commercially available or easily synthesized by well-known organic synthesis reaction pathways, well-known to those skilled in the art.

In particular, orthometalated ligands (H—C^N) can be notably prepared in good to excellent yield, using the Suzuki coupling of the substituted imidazole compound with corresponding arylboronic acids as described in Non Patent Citation 0002: LOHSE, Olivier. The Palladium Catalyzed Suzuki Coupling of 2- and 4-chloropyridines. *Syn. Lett.*, 1999 no. 1, p. 15-18.

and in

Patent Citation 0005: U.S. Pat. No. 6,670,645 (DU PONT DE NEMOURS). 2003, Dec. 30.

Synthetic methods particularly adapted to the preparation of fluorinated ortho-metalated ligands (H—C^N) are described in Patent Citation 0006: JP 2003113164 A (MITSUBISHI MATERIALS CORP). 2003, Apr. 18.

and in

Patent Citation 0007: JP 2003113163 A (MITSUBISHI MATERIALS CORP). 2003, Apr. 18.

Should the transition metal be iridium, trihalogenated iridium (III) compounds such as $IrCl_3 \cdot H_2O$, hexahalogenated Iridium (III) compounds, such as $M°_3IrX°_6$, wherein $X°$ is a halogen, preferably Cl and $M°$ is an alkaline metal, preferably K, and hexahalogenated iridium (IV) compounds such as $M°_2IrX°_6$, wherein $X°$ is a halogen, preferably Cl and $M°$ is an alkaline metal, preferably K (Ir halogenated precursors, hereinafter) can be used as starting materials to synthesize the complexes of formula (I), as above described.)

$[C^N]_2Ir(\mu\text{-}X°)_2Ir[C^N]_2$ complexes (compound VI, wherein M=Ir), with $X°$ being a halogen, preferably Cl, can be thus prepared from said Jr halogenated precursors and the appropriate orthometalated ligand by literature procedures (S. Sprouse, K. A. King P. J. Spellane, R. J. Watts, J. Am. Chem. Soc., 1984, 106, 6647-6653; M. E. Thompson et al., Inorg. Chem., 2001, 40(7), 1704; M. E. Thompson et al., J. Am. Chem. Sic., 2001, 123(18), 4304-4312).

Reaction is advantageously carried out using an excess of the neutral form of the orthometalated ligand (H—C^N); high-boiling temperature solvents are preferred.

To the purpose of the invention, the term high-boiling temperature solvent is intended to denote a solvent having a boiling point of at least 80° C., preferably of at least 85° C., more preferably of at least 90° C. Suitable solvents are for instance methoxyethanol, ethoxyethanol, glycerol, dimethylformamide (DMF), N-methylpyrrolidone (NMP), dimethylsulfoxide (DMSO), and the like; said solvents can be used as such or in admixture with water.

Optionally reaction can be carried out in the presence of a suitable Brønsted base, such as metal carbonates, in particular potassium carbonate ($K_2CO_3$), metal hydrides, in particular sodium hydride (NaH), metal ethoxide or metal methoxide, in particular $NaOCH_3$, $NaOC_2H_5$, alkylammonium hydroxides, in particular tetramethylammonium hydroxide, or imidazolium hydroxides.

A nucleophilic substitution at the metal atom with a suitable ligand L, as above defined to form corresponding $[C^N]_2IrL$ (formula I, wherein Me=Ir here above) is advantageously carried out by contacting roughly stoichiometric amount of ligand L with bridged intermediate (VI) in a suitable solvent.

Polar aprotic solvents are generally preferred for this reaction; a solvent which gave particularly good results is methylene dichloride ($CH_2Cl_2$).

Otherwise, according to a second embodiment, complexes of formula (I) here above can be synthesized by first reacting a suitable halogenated precursor with the β-diketonate ligands to yield a β-diketonate intermediate (formula VII here below), and then reacting said β-diketonate intermediate with the orthometalated ligands (H—C^N), as sketched in the following scheme:

It is also understood that the β-diketonate intermediate (formula VII) can be commercially available from easy accessible sources; in such a case, the complex of formula (I) can be manufactured following the second step in scheme here above, by reaction with the orthometalated ligands (H—C^N).

Nucleophilic reaction between the β-diketonate intermediate (formula VII) and the orthometalated ligands (H—C^N) can be notably carried out in the presence of a suitable Brønsted base, such as metal carbonates, in particular potassium carbonate ($K_2CO_3$), metal hydrides, in particular sodium hydride (NaH), metal ethoxide or metal methoxide, in particular $NaOCH_3$, $NaOC_2H_5$, alkylammonium hydroxides, in particular tetramethylammonium hydroxide, or imidazolium hydroxides.

High-boiling temperature solvents are preferred. To the purpose of the invention, the term high-boiling temperature solvent is intended to denote a solvent having a boiling point of at least 80° C., preferably of at least 85° C., more preferably of at least 90° C. Suitable solvents are for instance ethoxyethanol, glycerol, dimethylformamide (DMF), N-methylpyrrolidone (NMP), dimethylsulfoxide (DMSO), and the like; said solvents can be used as such or in admixture with water.

The present invention is also directed to the use of the light emitting material as above described in the emitting layer of an organic light emitting device (OLED).

Furthermore, the present invention is directed to the use of the light emitting material as above described as dopant in a host layer, functioning as an emissive layer in an organic light emitting device.

Should the light emitting material be used as dopant in a host layer, it is generally used in an amount of at least 1% wt, preferably of at least 3% wt, more preferably of least 5% wt with respect to the total weight of the host and the dopant and generally of at most 25% wt, preferably at most 20% wt, more preferably at most 15% wt.

The present invention is also directed to an organic light emitting device (OLED) comprising an emissive layer (EML), said emissive layer comprising the light emitting material as above described, optionally with a host material (wherein the light emitting material as above described is preferably present as a dopant), said host material being notably adapted to luminesce when a voltage is applied across the device structure.

The OLED generally comprises:

a glass substrate;

an anode, generally transparent anode, such as an indium-tin oxide (ITO) anode;

a hole transporting layer (HTL);

an emissive layer (EML);

an electron transporting layer (ETL);

a cathode, generally a metallic cathode, such as an Al layer.

For a hole conducting emissive layer, one may have an exciton blocking layer, notably a hole blocking layer (HBL) between the emissive layer and the electron transporting layer. For an electron conducting emissive layer, one may have an exciton blocking layer, notably an electron blocking layer (EBL) between the emissive layer and the hole transporting layer. The emissive layer may be equal to the hole transporting layer (in which case the exciton blocking layer is near or at the anode) or to the electron transporting layer (in which case the exciton blocking layer is near or at the cathode).

The emissive layer may be formed with a host material in which the light emitting material as above described resides as a guest or the emissive layer may consist essentially of the light emitting material as above described itself. In the former case, the host material may be a hole-transporting material selected from the group of substituted tri-aryl amines. Preferably, the emissive layer is formed with a host material in which the light emitting material resides as a guest. The host material may be an electron-transporting material selected from the group of metal quinoxolates (e.g. aluminium quinolate ($Alq_3$), lithium quinolate (Liq)), oxadiazoles and triazoles. An example of a host material is 4,4'-N,N'-dicarbazole-biphenyl ["CBP"], which has the formula:

CBP

Optionally, the emissive layer may also contain a polarization molecule, present as a dopant in said host material and having a dipole moment, that generally affects the wavelength of light emitted when said light emitting material as above described, used as dopant, luminesces.

A layer formed of an electron transporting material is advantageously used to transport electrons into the emissive layer comprising the light emitting material and the (optional) host material. The electron transporting material may be an electron-transporting matrix selected from the group of metal quinoxolates (e.g. $Alq_3$, Liq), oxadiazoles and triazoles. An example of an electron transporting material is tris-(8-hydroxyquinoline)aluminum of formula ["$Alq_3$"]:

$Alq_3$

A layer formed of a hole transporting material is advantageously used to transport holes into the emissive layer comprising the light emitting material as above described and the (optional) host material. An example of a hole transporting material is 4,4'-bis[N-(1-naphthyl)-N-phenylamino]biphenyl ["α-NPD"].

α-NPD

The use of an exciton blocking layer ("barrier layer") to confine excitons within the luminescent layer ("luminescent zone") is greatly preferred. For a hole-transporting host, the blocking layer may be placed between the emissive layer and the electron transport layer. An example of a material for such a barrier layer is 2,9-dimethyl-4,7-diphenyl-1,10-phenanthroline (also called bathocuproine or "BCP"), which has the formula

BCP

Figure 1:
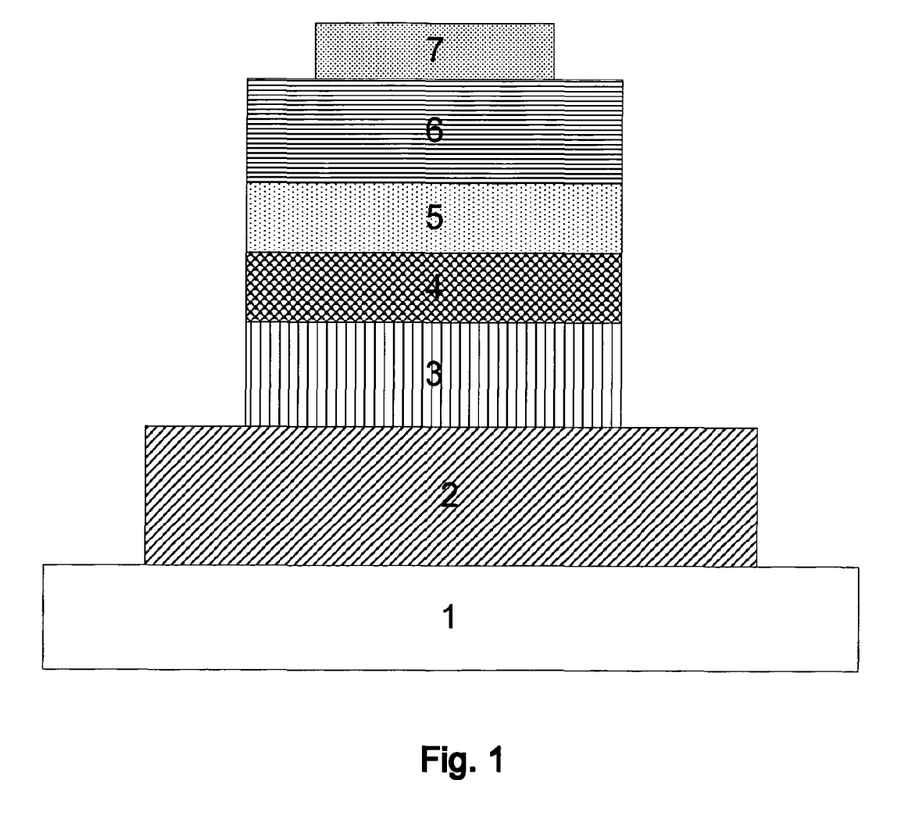
FIG. 1 is a diagram of the Organic Light-Emitting Diode (OLED) with a multilayer structure.

The OLED has preferably a multilayer structure, as depicted in FIG. 1, wherein 1 is a glass substrate, 2 is an ITO layer, 3 is a HTL layer comprising α-NPD, 4 is an EML comprising CBP as host material and the light emitting material as above defined as dopant in an amount of about 8% wt with respect to the total weight of host plus dopant; 5 is a HBL comprising BCP; 6 is an ETL comprising Alq$_3$; 7 is an Al layer cathode.

EXAMPLES

Synthesis of the 1-methyl-2-phenyl-imidazole 2-phenylimidazole (5 g) was taken into 150 ml of THF. To this solution 2.3 g of NaH were added. After refluxing for an hour under nitrogen 5.9 g of methyl iodide were added. The reaction mixture was refluxed for another 3 hours under nitrogen and then quenched with 5 ml of water. The solution was evaporated to dryness, and 200 ml of ethylacetate were added. The solution was washed with water and dried over MgSO$_4$. The resulting product was column purified on a SiO$_2$ using dichloromethane methane solvent mixture (95:5). The purified product is colourless oil. $^1$H NMR (CDCl$_3$) δ 7.55 (2H, d, J=4.5 Hz), 7.34(3H, dd J=5.3, 1.76), 7.01 (1H, d J=1.2 Hz), 6.85 (1H, d 1.2 Hz), 3.6 (3H, s).

Synthesis of [(1-methyl-2-phenyl-imidazole)$_2$IrCl]$_2$ Complex [Complex (VIII)]

(VIII)

1-methyl-2-phenyl-imidazole (0.45 g 2.84 mmol) and IrCl$_3$.3H$_2$O (0.5 g 1.41 mmol) were refluxed overnight in a 3:1 mixture of methoxyethanol/H$_2$O (100 ml). After being cooled to room temperature, water (30 ml) was added and the precipitate was filtered, washed with water and Et$_2$O to afford 0.55 g (68%) of the desired dimer (complex (VIII)) as a yellowish powder. Because of the low solubility of this compound, its $^1$H-NMR was recorded in DMSO-d$^6$ as its [C^N]$_2$Ir(Cl) (DMSO) derivative. $^1$H-NMR (DMSO-d$^6$, 298K, 200 MHz, δ ppm) δ 3.347 (s, 6H), 5.93 (d, J=3 Hz, 1H), 6.31 (d, J=2.8 Hz, 1H), 6.65 (m, 2H), 6.77 (m, 2H), 7.32 (d, J=2.0 Hz 2H), 7.46 (m, 3H), 7.76 (d, J=1.8 Hz, 1H).

Synthesis of [1-methyl-2-phenyl-imidazole)$_2$Ir (acac)] Complex [Complex (III)]

271 mg (0.25 mmol) of complex (VIII) were dissolved in 50 ml of dichloromethane under inert atmosphere. Separately, 100 mg (1.00 mmol) of acetylacetone were mixed in 1 ml of ethanol with 400 mg (0.5 mmol) of tetrabutylammonium hydroxide [C$_4$H$_9$)$_4$ NOH.30 H$_2$O].

The so obtained solutions were mixed and heated at reflux during 4 hours. Complex (III) was isolated as a yellow pale green air-stable complex. 250 mg of solid were obtained (yield: 82%), which were characterized by $^1$H-NMR in CH$_2$Cl$_2$.

$^1$H-NMR (CDCl$_3$, 298 K, 200 MHz, δ ppm) δ 1.79 (s, 6H of acetyl acetonate CH$_3$), 4.1 (s, 6H of imidazole CH$_3$), 5.16 (s, 1H of acetyl acetonate CH), 6.4 (dd, J=7.46 and 1 Hz, 2H), 6.65 (d, J=7.26 and 1 Hz, 2H), 6.69 (dt, J=7.3 and 1.3 Hz, 2H), 6.90 (d, J=1.46 Hz, 2H), 7.00 (d, J=1.49 Hz, 2H), and 7.38 (dd, J=7.55 and 1.46 Hz, 2H).

Figure 2:
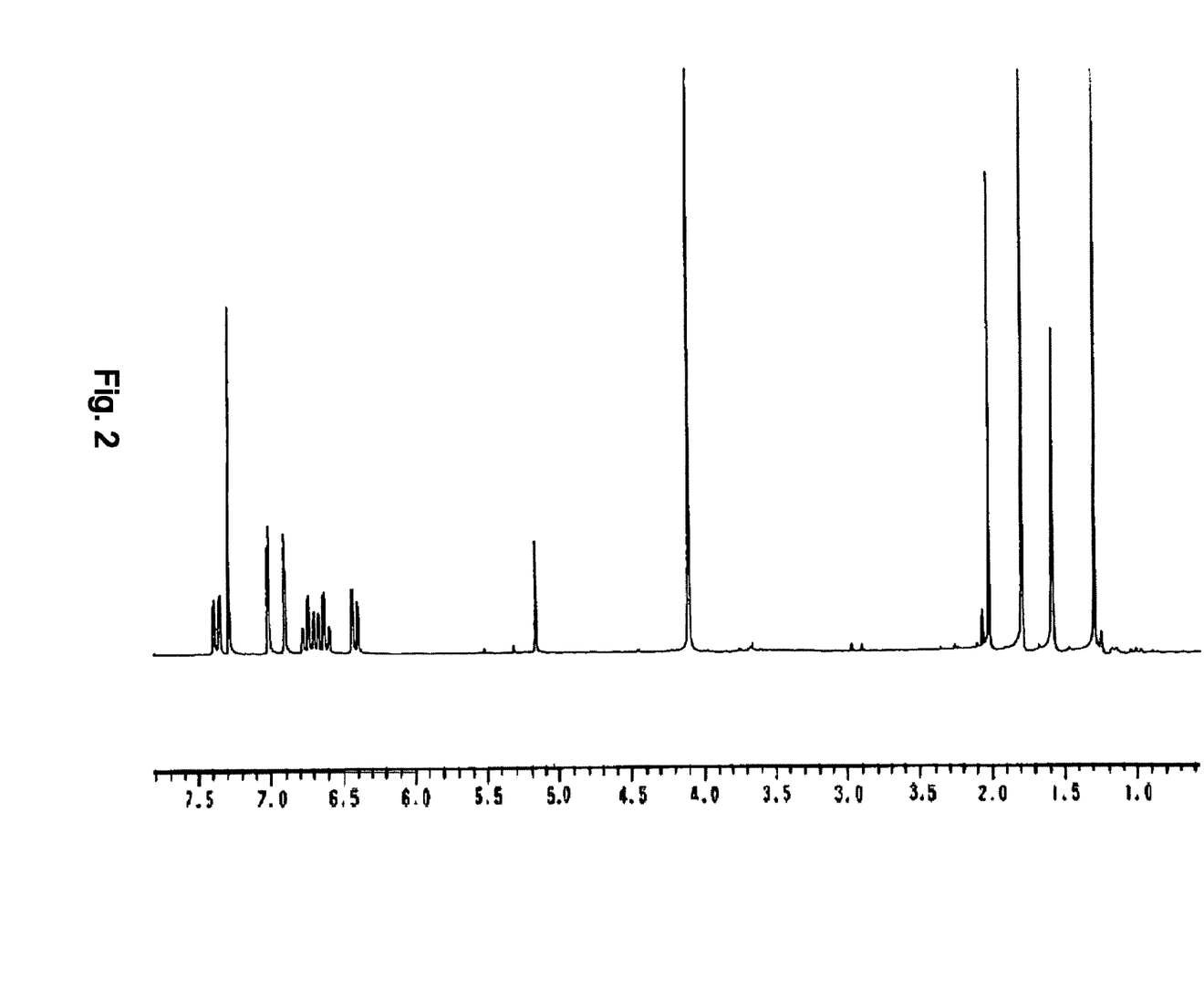
FIG. 2 is the $^1$H-NMR spectrum of the complex (III) measured in CDC1$_3$ at 298° C.

FIG. 2 shows the $^1$H-NMR spectrum of the complex (III) measured in CDCl$_3$ at 298° C., which was found to be consistent with the proposed structure; the abscissa stands for δ in ppm.

Figure 3:
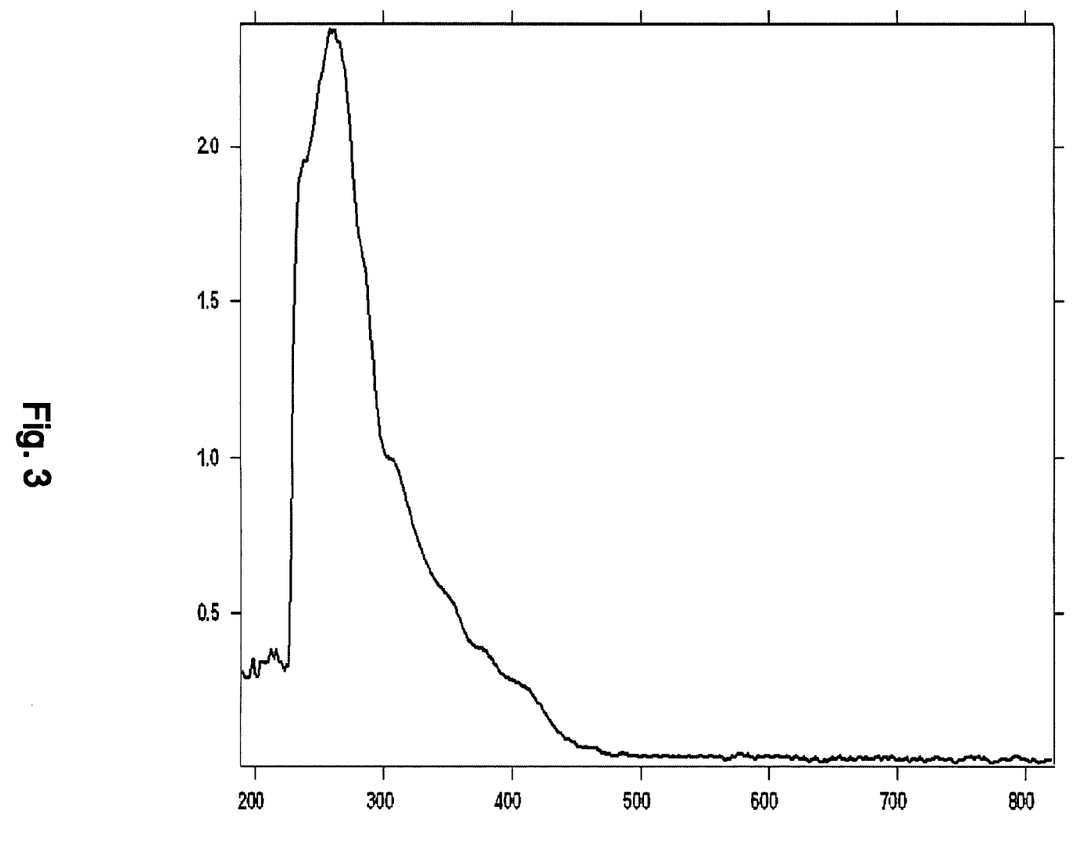
FIG. 3 is the absorption spectra registered from a complex (III) solution in dichloromethane at 273 K by excitation at 380 nm.

FIG. 3 shows the absorption spectra registered from a complex (III) solution in dichloromethane at 273 K by excitation at 380 nm; the abscissa stands for the wavelength in nm and the ordinate stands for absorbance (OD).

Figure 4:
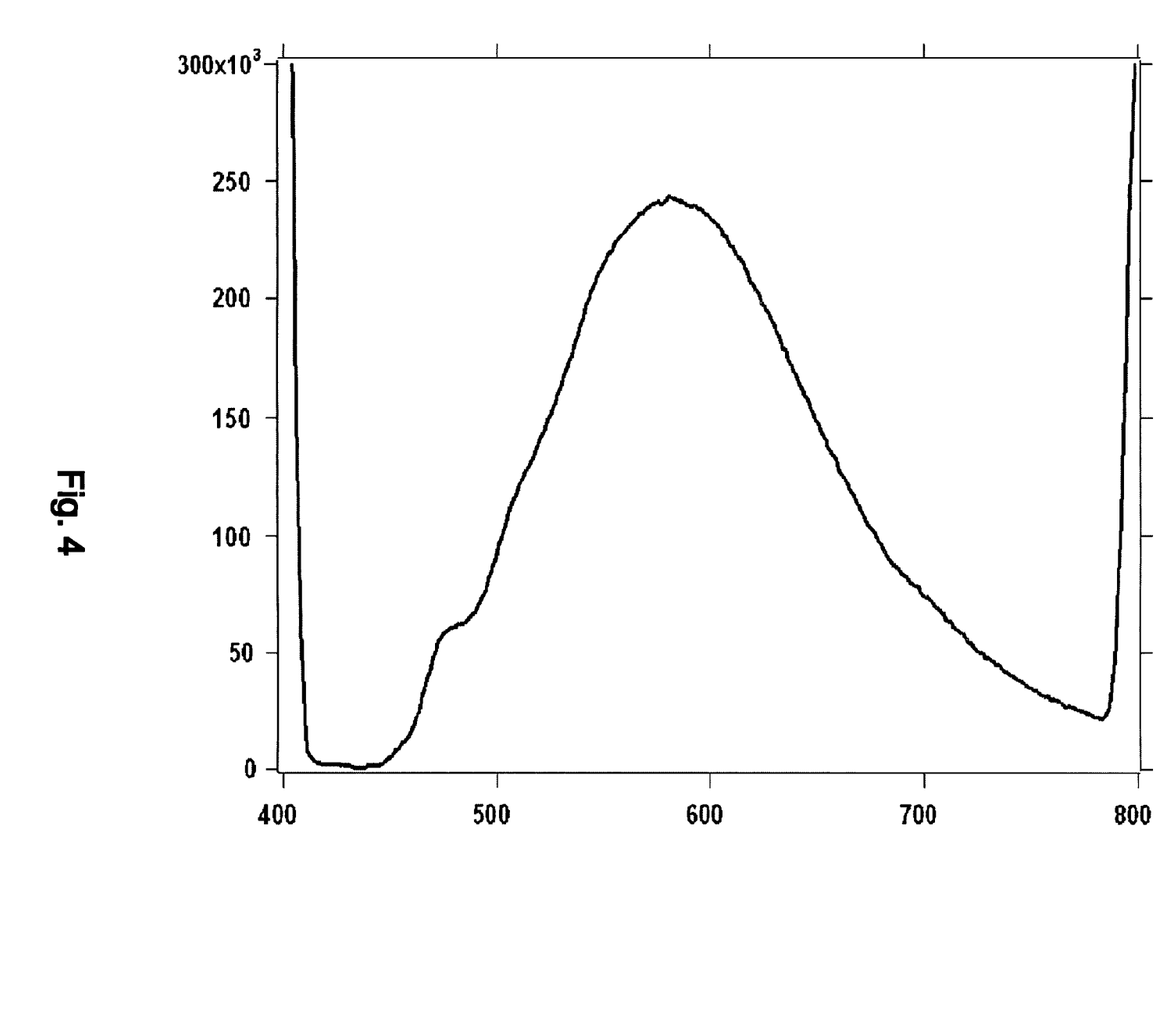
FIG. 4 is the emission spectra registered from a complex (III) solution in dichloromethane at 273 K by excitation at 380 nm.

FIG. 4 shows the emission spectra registered from a complex (III) solution in dichloromethane at 273 K by excitation at 380 nm; the abscissa stands for the wavelength in nm and the ordinate stands for emission intensity (cps). Zone Name: A1,AMD

The invention claimed is:

1. An organic light emitting device suitable for white electroluminescent emission comprising an emissive layer, wherein the device contains only one emissive layer, the emissive layer consisting essentially of a light emitting material, or consisting essentially of a light emitting material which resides as a guest in a host material, wherein the light emitting material consists essentially of a neutral complex comprising orthometalated ligands comprising imidazole moieties which are not condensed to a further aromatic ring and an ancillary ligand of the β-diketonate type wherein the neutral complex is represented by formula (I):

(I)

wherein:

M represents a transition metal of atomic number of at least 40;

Y is a group selected from the group consisting of —CH═CH—, —CR═CH—, —CR═CR—, N—H, N—R$^1$, O, S, and Se;

R is the same or different at each occurrence and is —F, —Cl, —Br, —NO$_2$, —CN; or a straight-chain or branched or cyclic alkyl or alkoxy group or dialkylamino group having from 1 to 20 carbon atoms, in each of which one or more nonadjacent —CH$_2$— groups may be replaced by —O—, —S—, —NR$^1$—, or —CONR$^2$—, and in each of which one or more hydrogen atoms may be replaced by F; an aryl or heteroaryl group having from 4 to 14 carbon atoms which may be substituted by one or more non aromatic radicals; and a plurality of substituents R, either on the same ring or on the two different rings, may in turn together form a further mono- or polycyclic ring system, optionally aromatic;

R$^1$, R$^2$, the same or different from each other and at each occurrence, are independently H or an aliphatic or aromatic hydrocarbon radical having from 1 to 20 carbon atoms;

R$_A$ and R$_B$, equal to or different from each other and at each occurrence are independently selected from the group consisting of —F, —Cl, —Br, —NO$_2$, —CN; and a straight-chain or branched or cyclic alkyl or alkoxy group having from 1 to 20 carbon atoms, in each of which one or more nonadjacent —CH$_2$— groups may be replaced by —O—, —S—, —NR$^1$—, or —CONR$^2$—, and in each of which one or more hydrogen atoms may be replaced by F; an aryl or heteroaryl group having from 4 to 14 carbon atoms which may be substituted by one or more nonaromatic radicals;

R$_D$ and R$_E$, equal to or different from each other and at each occurrence, are independently selected from the group consisting of C$_1$-C$_6$ alkyl or aryl, fluoro- or perfluoroalkyl or aryl groups;

R$_c$ is independently selected from C1-C6 alkyl or aryl groups;

a is an integer from 0 to 4;
b is an integer from 0 to 2.

2. The organic light emitting device of claim 1, wherein said neutral complex has the general formula II:

(II)

wherein M, a, b, R$_A$, R$_B$, R$_C$, R$_D$ and R$_E$ have the same meaning as defined in claim 1.

3. The organic light emitting device of claim 2, wherein the neutral complex has the formula III:

(III)

4. The organic light emitting device of claim 2 wherein a and b are 0.

5. The organic light emitting device of claim 4 wherein R$_c$, R$_D$ and R$_E$, which may be the same or different are independently selected from C$_1$-C$_6$ alkyl or aryl groups.

6. The organic light emitting device of claim 4 wherein R$_c$, R$_D$ and R$_E$, which may be the same or different are independently selected from C$_1$-C$_6$ alkyl groups.

7. The organic light emitting device of claim 4 wherein R$_c$, R$_D$ and R$_E$, which may be the same or different are independently selected from the group consisting of methyl, i-propyl, n-butyl, phenyl and benzyl.

8. The organic light emitting device of claim 1, wherein M represents a transition metal of groups 8 to 12.

9. The organic light emitting device of claim 1, wherein M represents Ir or Pt.

10. The organic light emitting device of claim 1, wherein M represents Ir.

11. The organic light emitting device of claim 1, wherein Y is a group selected from the group consisting of —CH═CH—, —CR═CH— and S.

12. The organic light emitting device of claim 1, wherein Y is —CH═CH—.

13. The organic light emitting device of claim 1, wherein either or both of R$_A$ and R$_B$ are fluorine group(s) (—F) and/or alkoxy group(s) having from 1 to 20 carbon atoms.

14. The organic light emitting device of claim 1, wherein R$_D$ and R$_E$, equal or different from each other and at each occurrence, are independently selected from the group consisting of —CH$_3$, —C$_6$H$_5$, —C$_6$H$_4$(CH$_3$), —nC$_4$H$_9$, —iC$_3$H$_7$, —CF$_3$, —C$_2$F$_5$, —C$_6$F$_5$, —C$_3$F$_7$, and C$_1$-C$_6$ alkyl, fluoro- or perfluoroalkyl groups having one or more ether groups and $R_c$ is independently selected from the group consisting of —$CH_3$, —$C_6H_5$, —$C_6H_4(CH_3)$, —$nC_4H_9$, -$iC_3H_7$.

15. The organic light emitting device of claim 1, wherein $R_C$, $R_D$ and $R_E$ are independently chosen among $C_1$-$C_6$ alkyl groups.

16. The organic light emitting device of claim 1, wherein $R_C$, $R_D$ and $R_E$ are selected from the group consisting of methyl, ethyl, n-propyl, i-propyl, and n-butyl groups.

17. A method for developing white electroluminescent emission in an organic light emitting device comprising an emissive layer, wherein the device contains only one emissive layer, the emissive layer consisting essentially of a light emitting material, or consisting essentially of a light emitting material which resides as a guest in a host material, the improvement comprising using a light emitting material consisting essentially of a neutral complex comprising orthometalated ligands comprising imidazole moieties which are not condensed to a further aromatic ring and an ancillary ligand of the β-diketonate type wherein the neutral complex is represented by formula (I) of claim 1.

18. A method for developing white electroluminescent emission in an organic light emitting device comprising a host layer consisting essentially of a light emitting material, comprising using a light emitting material as dopant in the host layer, functioning as an emissive layer in the organic light emitting device, wherein the device contains only one emissive layer, and the light emitting material comprising a neutral complex comprising orthometalated ligands comprising imidazole moieties which are not condensed to a further aromatic ring and an ancillary ligand of the β-diketonate type wherein the neutral complex is represented by formula (I) of claim 1.

19. The organic light emitting device of claim 1, wherein the emissive layer consists essentially of the light emitting material which resides as a guest in the host material, wherein the light emitting material is present in an amount of at most 25 wt. % with respect to the total weight of the host and the guest.

* * * * *